United States Patent
Kochman et al.

(10) Patent No.: US 6,229,123 B1
(45) Date of Patent: *May 8, 2001

(54) SOFT ELECTRICAL TEXTILE HEATER AND METHOD OF ASSEMBLY

(75) Inventors: Arkady Kochman, Mt. Prospect; Arthur Gurevich, Wilmette, both of IL (US)

(73) Assignee: Thermosoft International Corporation, Palatine, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/160,540

(22) Filed: Sep. 25, 1998

(51) Int. Cl.[7] ........................................ H05B 3/34
(52) U.S. Cl. ............................... 219/549; 219/529
(58) Field of Search ........................ 219/549, 528, 219/529, 544, 545, 548; 338/208, 210, 211, 275, 262, 258, 259

(56) References Cited

U.S. PATENT DOCUMENTS

| | | | |
|---|---|---|---|
| 1,703,005 | * | 2/1929 | Hewitt ................................. 219/529 |
| 2,496,279 | * | 2/1950 | Ely et al. ............................. 219/528 |
| 3,349,359 | | 10/1967 | Morey . |
| 3,385,959 | | 5/1968 | Ames et al. . |
| 3,657,516 | | 4/1972 | Fujihara . |
| 3,774,299 | | 11/1973 | Sato et al. . |
| 3,935,422 | | 1/1976 | Barnes et al. . |
| 4,100,673 | * | 7/1978 | Leavines ................................ 29/611 |
| 4,149,066 | | 4/1979 | Niibe . |
| 4,250,397 | | 2/1981 | Gray . |
| 4,309,596 | | 1/1982 | Crowley . |
| 4,436,986 | * | 3/1984 | Carlson ................................. 219/505 |
| 4,485,297 | * | 11/1984 | Grise et al. ............................ 219/528 |
| 4,538,054 | | 8/1985 | de la Bretoniere . |
| 4,654,511 | * | 3/1987 | Horma et al. .......................... 219/548 |
| 4,713,531 | | 12/1987 | Fennekels et al. . |
| 4,722,860 | * | 2/1988 | Doljack et al. ........................ 442/111 |
| 4,764,665 | | 8/1988 | Orban et al. . |
| 4,825,049 | | 4/1989 | Rickborn . |
| 4,952,783 | * | 8/1990 | Aufderheide et al. ................ 219/528 |
| 4,983,814 | | 1/1991 | Ohgushi et al. . |
| 5,023,433 | | 6/1991 | Gordon . |
| 5,068,518 | | 11/1991 | Yasuda . |
| 5,111,025 | * | 5/1992 | Barma et al. .......................... 219/217 |
| 5,298,722 | | 3/1994 | Tanaka . |
| 5,412,181 | * | 5/1995 | Giamati ................................. 219/548 |
| 5,801,914 | * | 9/1998 | Thrash ................................... 361/104 |
| 6,031,214 | * | 2/2000 | Bost et al. ............................. 219/545 |

* cited by examiner

*Primary Examiner*—Tu Ba Hoang
*Assistant Examiner*—Quang Van
(74) *Attorney, Agent, or Firm*—Liniak, Berenato, Longacre & White

(57) ABSTRACT

A soft heater utilizing metal fiber containing, carbon, metal or conductive ink coated threads, embroidered on, laminated between or woven into a nonconductive substrate to form electrical heating circuits. The heating element may be manufactured in a form of strip, sheet, sleeve or strand of threads for incorporation into plurality of articles. The soft heating element core may contain localized treatment such as positive temperature coefficient (PTC) material for temperature self-limiting control. The electrode conductors are attached to said heating element core which is connected in parallel or in series. The heating element core is shaped in a desired pattern. The whole assembly is sealed by at least one electrically insulated layer which envelopes the strips, sheets, sleeves, ropes or strands of threads.

44 Claims, 7 Drawing Sheets

SOFT ELECTRICAL TEXTILE HEATER AND METHOD OF ASSEMBLY

BACKGROUND OF INVENTION

1. Field of Invention

This invention relates to soft electrical heaters, and particularly to heating elements, which have a soft and strong metal containing fiber or carbon containing fiber electrically conductive core.

2. Description of the Prior Art

Heating elements have extremely wide applications in household items, construction, industrial processes, etc. Their physical characteristics, such as thickness, shape, size, strength, flexibility and other characteristics affect their usability in various applications.

Numerous types of thin and flexible heating elements have been proposed, for example U.S. Pat. No. 4,764,665 to Orban et al. This patent discloses an electrically heated fabric for use in gloves, airfoils and aircraft parts. In this patent the fabric is metallized after being formed in a glove structure, following weaving or arranging in a non-woven format. Copper bus bars are utilized for introduction of electrical current to the metallized textile. Having been made of a solid piece of fabric with metallized coating, this heating element doesn't allow for flexibility in selection of desired power density. The metallizing of the formed heating element results in a loss of significant economies of scale, only a small number of embodiments can be achieved, thus severely limiting the potential application of this invention. The '665 design is also not conducive to tight hermetic sealing through the heater areas (no gaps inside), which can cause a short circuit through puncture and admission of liquid into the body of heating element. This element can't be used with higher temperatures due to the damage that would be caused to the polyaramid, polyester or cotton metallized fabric, described in the invention.

Another prior art example is U.S. Pat. No. 4,713,531 to Fennekels et al. Fennekels et al. discloses a sheet textile structure combined with resistance elements. These resistance elements comprise metallic fibers or filaments with a denier like that of natural or synthetic textile fibers, and with overall cross sectional thickness of 8 to 24 microns. The '531 design suffers from the following drawbacks: being a sheet product, it is not conducive to hermetic sealing through the body of the heater (no gaps inside), only perimeter sealing is possible, which can result in a short circuit due to puncture and admission of liquid into the body of the heating element; yarns are very heavy: from 1 to 7 grams per 1 meter of yarn; the use of silver fibers makes these yarns very expensive; individual conductors have a large cross sectional thickness, each having a outer sheath of braided textile or elastomer.

Another prior art example is U.S. Pat. No. 4,538,054 to de la Bretoniere. The heating element of de la Bretoniere '054 suffers from the following drawbacks: its manufacturing is complex requiring weaving of metal or carbon fibers into non-conductive fabric in a strictly controlled pattern; the use of the metal wire can result in breakage due to folding and crushing and it affects softness, weight and flexibility of the finished heater; it can not be manufactured in various shapes, only a rectangular shape is available; only perimeter sealing is possible (no gaps inside), which can result in a short circuit due to puncture and admission of a liquid into the body of the heating element; the method of interweaving of wires and fibers does not result in a strong heating element, the individual wires can easily shift adversely affecting the heater durability; the fabric base of the heating element is flammable and may ignite as a result of a short circuit; it is not suitable for high temperature applications due to destruction of the insulating weaving fibers at temperatures exceeding 120° C.

U.S. Pat. No. 4,149,066 to Niibe at. al. describes a sheet-like thin flexible heater made with an electro-conductive paint on a sheet of fabric. This method has the following disadvantages: the paint has a cracking potential as a result of sharp folding, crushing or punching; the element is hermetically sealed only around its perimeter, therefore lacking adequate wear and moisture resistance; such an element can't be used with high temperatures due to destruction of the underlying fabric and thermal decomposition of the polymerized binder in the paint; the assembly has 7 layers resulting in loss of flexibility and lack of softness.

Another prior art example is U.S. Pat. No. 4,309,596 to George C. Crowley, describing a flexible self-limiting heating cable, which comprises two conductor wires separated by a positive temperature coefficient (PTC) material. Said heating wires are disposed on strands of nonconductive fibers coated with conductive carbon. This method has the following disadvantages: (a) the wires are enveloped and separated by the tough PTC material which thickens and hardens the heating element (b) the distance between the wires is very limited, due to a nature of the PTC material having a high electrical resistance, this prevents manufacturing of heaters with large heat radiating surface; (c) the heater is limited only to one predetermined highest temperature level, therefore, this heating device is unable to bypass said temperature level when a quick heating at the highest temperature is needed.

The present invention seeks to alleviate the drawbacks of the prior art and describes the fabrication of heating element comprising metal fiber containing, metal coated, carbon containing or carbon coated textile threads, which is economical to manufacture; does not pose environmental hazards; results in a soft, flexible, strong, thin, and light heating element core, suitable for even small and complex assemblies, such as hardware. A significant advantage of the proposed invention is that it provides for fabrication of heating elements of various shapes and sizes, with predetermined electrical characteristics; allows for a durable heater, resistant to kinks and abrasion, and whose electrophysical properties are unaffected by application of pressure, sharp folding, small perforations, punctures and crushing.

SUMMARY OF THE INVENTION

The first objective of the invention is to provide a significantly safe and reliable heating element which can function properly after it has been subjected to sharp folding, kinks, small perforations, punctures or crushing, thereby solving problems associated with conventional flexible heating metal wires. In order to achieve the first objective, the electric heating element of the present invention is comprised of electrically conductive textile threads coated with metal, carbon, conductive ink, or their combination which possess the following characteristics: (a) high strength; (b) high strength-to-weight ratio; (c) very low coefficient of thermal expansion; (d) softness. The heating element core described in this invention is comprised of electrically conductive strips, sleeves, sheets, ropes, or strands of threads/fibers, which radiate a controlled heat over the entire heating core surface.

A second objective of the invention is to provide maximum flexibility and softness of the heating element. In order to achieve the second objective, the electric heating element of the invention contains thin (0.01 to 3.0 mm, but preferably within the range of 0.05–1.0 mm) threads, which are woven into, embroidered on, or stranded into continuous or electrically connected strips, sleeves/pipes, ropes, sheets, or bundles, then arranged and insulated to have gaps between the electrically conductive heating media. It is preferable that all insulation components of the heating element assembly are thin, soft and flexible materials.

A third objective of the invention is to provide for the uniform distribution of heat, without overheating and hot spots, thereby solving the problem of overinsulation and energy efficiency. In order to achieve this objective, (a) conductive threads in the heating elements are separated by non-conductive fibers yarns or polymers, (b) one side of the heating element may include a metallic foil or a metallized material to provide uniform heat distribution and heat reflection. It is also preferable that the soft heating elements of the invention are made without thick cushioning insulation, which slows down the heat delivery to the surface of the heating apparatus.

A forth objective of the invention is to provide for ease in the variation of heating power density, thereby solving a problem of manufacturing various heating devices with different electric power density requirements. In order to achieve the forth objective, the conductive threads/yarns in the heating element core are embroidered on, laminated between or woven into strips, ropes, sleeves/pipes, sheets, or stranded into bundles with predetermined width, density (of embroidering or weaving) and thickness. It is preferable that the strips, sleeves/pipes, sheets, ropes or strands are made of combination of threads/yarns with different electrical resistance and/or include electrically nonconductive high strength polymer or inorganic (such as refractory ceramic or fiberglass) fibers.

A fifth objective of the invention is to provide for ease in manufacturing of the heating element core, thereby eliminating a problem of impregnation of the whole fabric with stabilizing or filling materials to enable cutting to a desired pattern. In order to achieve the fifth objective, all strips, sleeves/pipes, sheets, ropes and threads are assembled into a desired stable shape prior to the heating element manufacturing.

A sixth objective of the invention is to provide a temperature self-limiting properties to the heating element core if dictated by the heater design thereby eliminating a need for thermostats. In order to achieve the sixth objective, the positive temperature coefficient (PTC) material is utilized in the selected areas of the heating element core.

The present invention comprises a heating element containing soft, strong and light electrically conductive threads/yarns acting as electrically conducting resistance heating media. The heating element is also highly resistant to punctures, cuts, small perforations, sharp folding and crushing. It can be manufactured in various shapes and sizes, and it can be designed for a wide range of parameters, such as input voltage, desired temperature range, desired power density, type of current (AC and DC) and method of electrical connection (parallel and in series). A heating element preferably consists of non-conductive fibers/yarns and electrically conductive metal containing or carbon containing threads/yarns woven into, embroidered on, laminated between or stranded into strips, ropes, sleeves/pipes, sheets or strands of threads.

The selected areas of the heating element core may contain highly conductive metal coated threads to provide redundant circuits in the heater. The heating element core may include a positive temperature coefficient (PTC) material to impart temperature self-limiting properties. The heating element core is shaped by folding or assembling of said conductive media into a predetermined pattern. The power supplying electrodes are attached to said heating element core and are electrically connected in parallel or in series. The soft heating element core is sealed to form an assembly containing at least one electrically insulating layer which envelops each strip, rope, sleeve/pipe, sheet or strand of threads.

DETAILED DESCRIPTION OF THE INVENTION

Figure 1A:
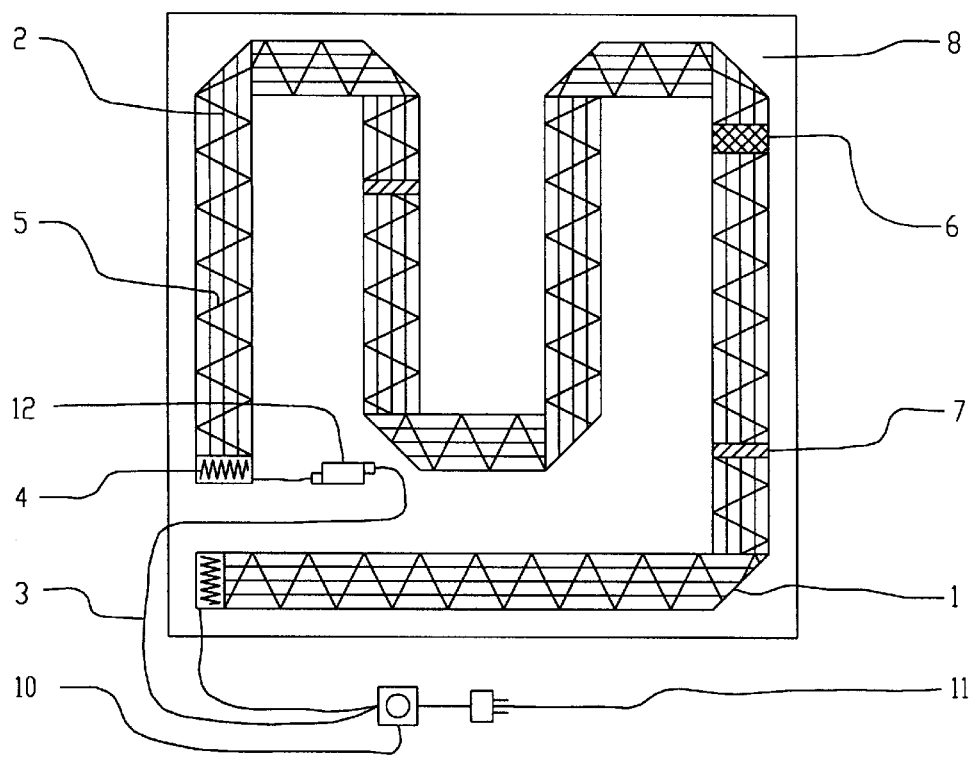
FIG. 1A shows a plan view of the heating element core electrically connected in series according to the preferred embodiment of the present invention.

The invention consists of a soft heating element core made by interconnecting of one or more of the following conductive threads with non-conductive fibers: metal fiber containing, metal coated or carbon containing threads/yarns. Said heating element core is incorporated into strips, sleeves, pipes, sheets and ropes. It may also take a form of a strand of threads. The heating element core may, along with electrically conducting metal fiber, metal coated and/or carbon containing threads, contain electrically non-conducting yarns/fibers in various proportion and/or weaving patterns in order to augment its electrical resistance.

For convenience of explanation of the invention, the term "thread" shall mean any of the following textile structures: stitching thread, knitting thread, weaving thread, yarn and other structures, composed of individual fibers or a combination of fibers where each individual fiber has a diameter small enough to make it as soft, flexible and pliable as a synthetic polymer fiber, such as polyester or nylon. It shall be also clearly understood that the term "metal fiber" is not the same as and is not interchangeable with the term "metal wire", the fiber being considerably thinner than the wire.

The heating element core described in this invention may comprise one of the following threads or their combination:

1. Metal coated synthetic polymer threads with similar or varying electrical characteristics.
2. Metal coated inorganic threads (made of ceramic or fiberglass fibers) with similar or varying electrical characteristics.
3. Carbon coated inorganic threads (made of ceramic or fiberglass fibers) with similar or varying electrical characteristics.
4. Threads impregnated with conductive ink with similar or varying electrical characteristics.
5. Threads, including metal fibers.
6. Threads, as indicated in 1 through 5 above, with addition of nonconductive polymer synthetic fibers.
7. Threads, as indicated in 1 through 5 above, with addition of nonconductive inorganic, including fiberglass, fibers.
8. Threads, as indicated in 1 through 7 above with addition of carbon/graphite threads.

The non-conductive material of the heating element core may be in a form of weaving yarns. In a case of an embroidered heating element and/or element made by laminating of conductive threads onto or between at least two layers of insulator, the non-conductive material may be in a form of woven or non-woven synthetic polymer or inorganic fibers/textile. The synthetic polymer may also be in a form of thin thermoplastic sheets, such as polyvinyl chloride (PVC), silicon rubber, polyethylene, polypropylene, polyurethane, etc.

The laminating of the conductive threads to the non-conductive substrate may be achieved by placing the threads between at least two layers of non-conductive material and subsequent thermal fusing of the sandwich assembly. It is also possible to utilize adhesive to laminate conductive and nonconductive threads to the insulating sleeve, sheet or strip, made of textile or thermoplastic.

The metal coated threads described below in this invention may comprise soft and highly electrically conductive metals such as silver, gold, copper, tin, nickel, zinc, their alloys or multi-layer combination. Such metal coatings may be applied on carbon/graphite, polymer, fiberglass or ceramic threads by sputtering, electroplating, electroless deposition or other appropriate techniques.

The metal fiber containing threads described in this invention comprise the following metals or their combination: tungsten, nickel, chromium, iron. The individual metal fibers within the threads have small enough thickness to make the threads as soft and flexible as those made of polymer textile materials, such as polyester or nylon.

The term "conductive ink" described below in this invention shall mean conductive ink, paint or adhesive made of electroconductive media, such as carbon, graphite or metal particles/fibers dispersed in a solution of nonconductive organic stabilizer.

The term "carbon containing threads" described below in this invention shall mean carbon/graphite threads or threads coated with carbon or carbon/graphite containing material.

The term "conductive textile" described below in this invention shall mean soft electrically conductive substrate comprising conductive threads and non-conductive materials such as woven or non-woven textile or thin thermoplastic.

A distinction in the materials used and in the component function must be made between the heating element core (electrical resistance heating means) and the electrode/bus conductors (conductive electrode means).

Higher resistance materials are utilized in the heating element core, which is the main working component of the heating element On the other hand, the bus conductors utilize lower resistance materials and merely supply electrical current to the heating element core. The electrode/bus conductors do not function as heating means.

FIG. 1A shows an example embodiment of electroconductive heating element core (1) in a form of a strip, folded so as to form gaps for subsequent sealing, and patterned as dictated by the heating element design. The conductive strip of the heating element core (1) consists of electroconductive threads (2), disposed longitudinally in a strip so as to be separated by non-conductive material. Such placement is achieved through weaving, embroidering or laminating of individual threads between at least two layers of insulating material.

Portions of the heating element core (1) may contain localized treatment in order to augment the electrical properties of the finished product, such localized treatment is performed by at least one of the following methods: (a) the use of electroconductive carbon or graphite carrying material (6); (b) the use of positive temperature coefficient (PTC) material (7); (c) the use of highly conductive bridging threads (5) in order to create redundant electrical circuits.

In order to control overheating, at least one temperature control device (12), such as thermostat, is placed within the plane of the heating element. The bends and folds along the length of the heating element core may be secured by at least one of the following shape holding means: (a) sewing with electroconductive threads, preferably metal coated threads, (b) sewing with non-conductive threads; (c) stapling; (d) gluing; (e) riveting; (f) fusing or sealing by breathable or hermetic insulating material (8).

The heating element core is energized through a power cord (3), which is connected to the heating element with metal electrodes (4). The electrodes are flexible and have a flat shape with large contact area. It is also preferable to use conductive textile electrodes comprising copper wires and carbon yarns or electrodes, embroidered to the ends of the heating element core by highly conductive threads. The electrodes may be attached to the ends of the heating element core by sewing, stapling, riveting or using of a toothed connector.

In addition to the electrodes, the power cord has the following attachments: (a) electric plug (11), (b) optional power control device (10), which may include one, some or all of the following: AC to DC converter, transformer, power level regulator, on/off switch.

Depending on the end use of the heating elements, the heating element assembly process utilizes the following operations in any sequence:

(a) folding and shaping the heating element core into a predetermined shape,
(b) attachment or embroidering of the electrodes to the heating element core,
(c) attachment of lead wires, optional thermostat(s) and the power cord to the heating element core,
(d) lamination of the heating element core with the insulating material,
(e) securing the pattern of the heating element assembly by the shape holding means.

Figure 10A:
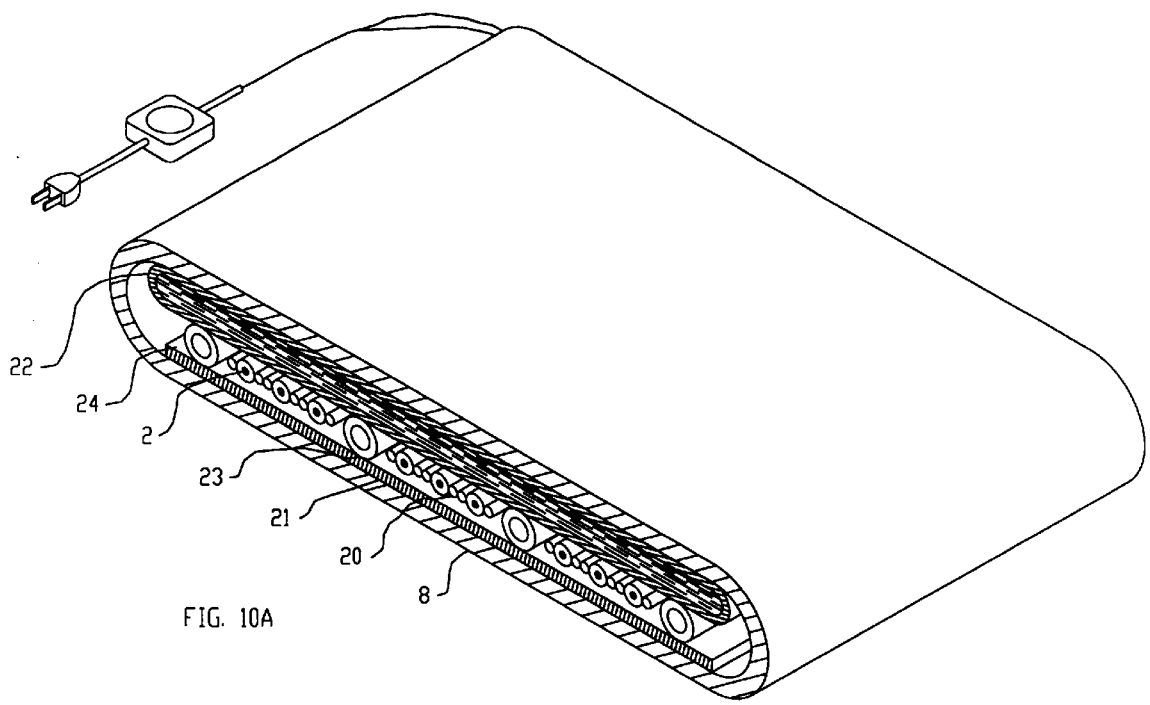
FIG. 10A is an isometric view of a therapeutic heating pad having separate cooling and heating circuits.
Figure 10B:
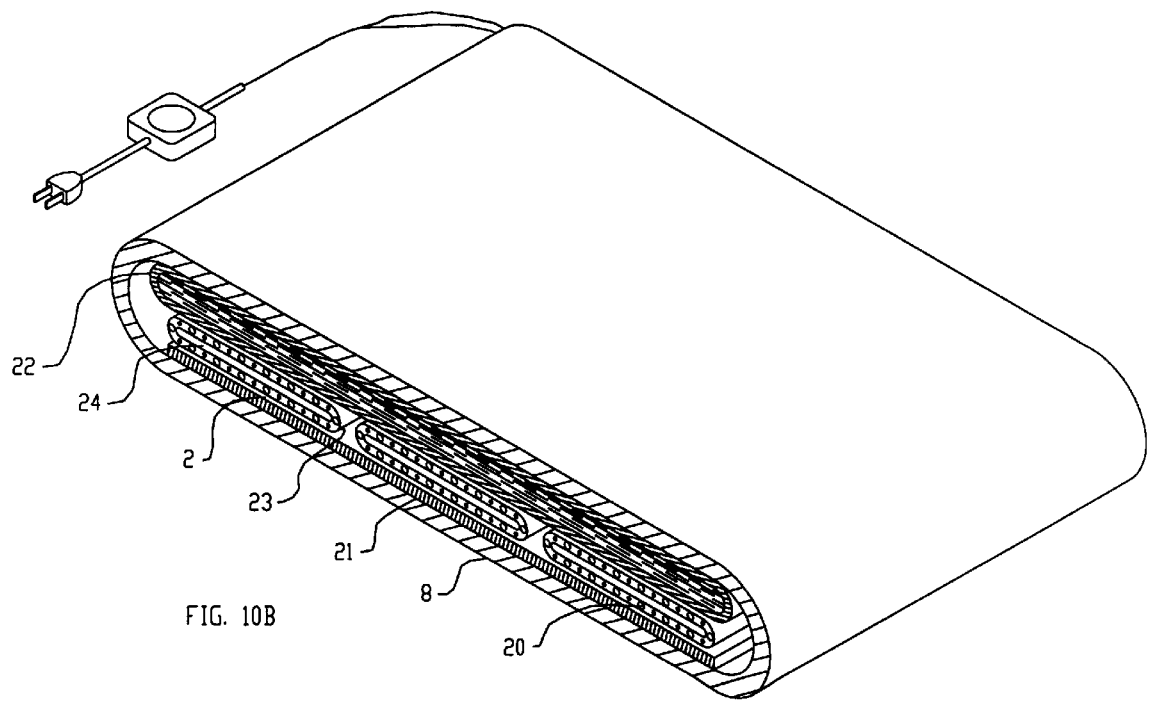
FIG. 10B is an isometric view of a therapeutic heating pad having combined cooling and heating circuits.

It is preferable to utilize a heat reflecting layer 21 of FIGS. 10A and 10B on one side of the insulated heating element core if dictated by the heating element design; such heat reflecting layer may be an aluminum foil or a metallized polymer, electrically insulated from the electroconductive heating element components.

Figure 1B:
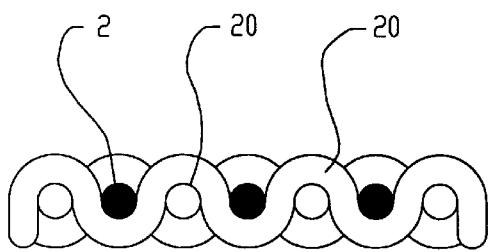
FIG. 1B shows a cross section of the heating element strip made of woven non-insulated conductive and non-conductive threads/yarns.

FIG. 1B shows a cross section of a woven textile heating means (strip) comprising weft yarns (20) consisting of non-conductive fibers, non-conductive warp yarns (20'), and electrically conductive warp yarns (2) consisting of electrically conductive textile threads.

Figure 1C:
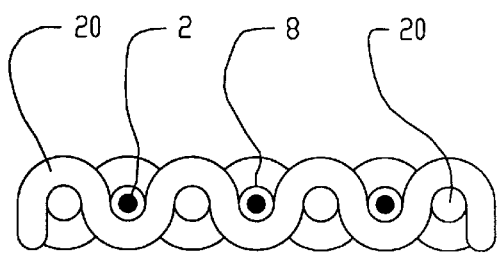
FIG. 1C shows a cross section of the heating element strip made of woven individually insulated conductive threads and nonconductive threads/yarns.

FIG. 1C shows a cross section of variation of the heating strip shown in FIG. 1B, where the electrically conductive warp threads (2) are individually insulated with electrically nonconductive insulation means (8). The conductive threads inside such individually insulated warp cables may comprise a combination of conductive and nonconductive threads. The insulation means may be in the form of extruded or jacketed PVC, polyethylene, silicon or rubber material.

Figure 1D:
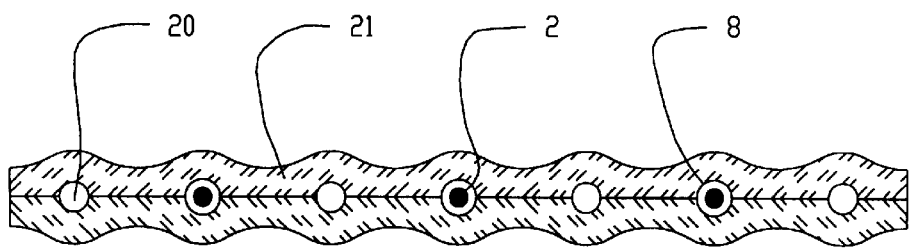
FIG. 1D shows a cross section of the heating element strip made by laminating of individually insulated conductive threads and nonconductive threads between two layers of nonconductive material.

FIG. 1D shows a cross section of a heating element where the conductive threads (2) and non-conductive threads (20) are laminated between two layers of non-conductive shape holding means (21). The electrically conductive threads (2) may be additionally individually insulated by insulating means (8) such as extruded PVC or other polymer.

Figure 2:
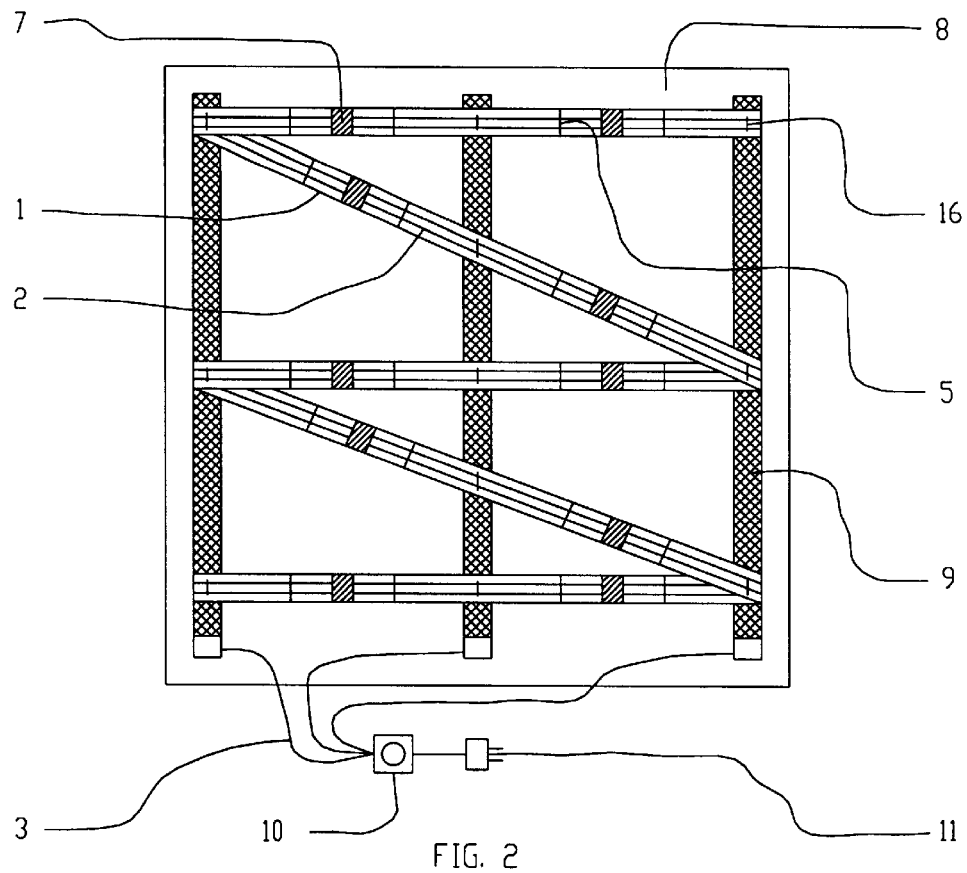
FIG. 2 shows a plan view of the heating element core connected in parallel, utilizing multi-level power output heating circuit design and optional local area treatments.

FIG. 2 shows an example of the heating element core (1) in a form of strips, folded and disposed between the electrical bus electrodes (9), the strips having a straight run and being attached to the parallel bus electrodes by stitching, stapling or riveting. The run of the zigzag, the distance between the peaks, may vary even in the same heating element, thereby varying the finished element temperature density as may be dictated by the heating element design. As a variation of this design, the length of heating element strip (1) between the bus electrodes may be shaped in a zigzag or other pattern instead of being straight. This enables a variation of the heating element resistance without varying the heating element core material. The heating element can also consist of separate parallel conductive strips electrically connected to the bus conductors. All strips in this embodiment are disposed in such manner as to create gaps between the adjacent strips in order to provide tight hermetic sealing and/or shape holding during insulation by the nonconductive material. The strips are tightly connected with bus conductors (9) by stitching (16), stapling or riveting.

A heating element of this design may contain optional localized treatment in order to augment the electrical properties of the finished product, such localized treatment may be one of the following methods: (a) the use of electroconductive carbon or graphite carrying material, (b) the use of positive temperature coefficient (PTC) material (7), (c) the use of bridging electroconductive threads (5), such as metal coated threads, in order to create redundant electrical circuits.

A novel method of controlling power output is utilized in this embodiment. By using the third bus electrode, shown in the middle, the power output can be varied by a factor of 4, at the same time, requiring 4 times fewer conductive threads. This provides a double benefit of a more versatile heater at a lesser cost. This heater has two working regimes, high power output and low power output.

In the low power output regime, the middle bus electrode is not energized and has no function other than a circuit bridge, providing redundancy in the path of electrical current. In the high power output regime, utilizing direct current, when the middle bus electrode is energized, the outer electrodes are switched to be fed by one power lead, with polarity, opposite to that of the middle bus electrode. When alternating current is utilized, polarity does not matter, however power supply circuit is identical to that of a direct current circuit—the middle bus electrode is fed by one power lead and the outer electrodes are fed by another.

Energizing the middle bus electrode enables the heater strips to complete the circuits in half the distance, thereby reducing their resistance by one half. This creates two heating circuits, each putting twice the power of the single larger heating circuit. Therefore, the power output from the heating element increases 4 times. Other numerous variations of this design are possible, based on the desired function.

There are examples of prior art where attempts were made to vary temperature and power output within a single heating element, U.S. Pat. No. 4,250,397 to Gray at al, U.S. Pat. No. 3,739,142 to Johns, and U.S. Pat. No. 4,788,417 to Graflind. They all use layering of heating elements to enable power variability. This layering creates considerably heavier, less flexible and more expensive heaters. Additionally, because the temperature between layers is considerably higher than that felt on the outside of the heater, a localized overheating may occur, melting an insulating layer and causing short circuit and fire.

Figure 3:
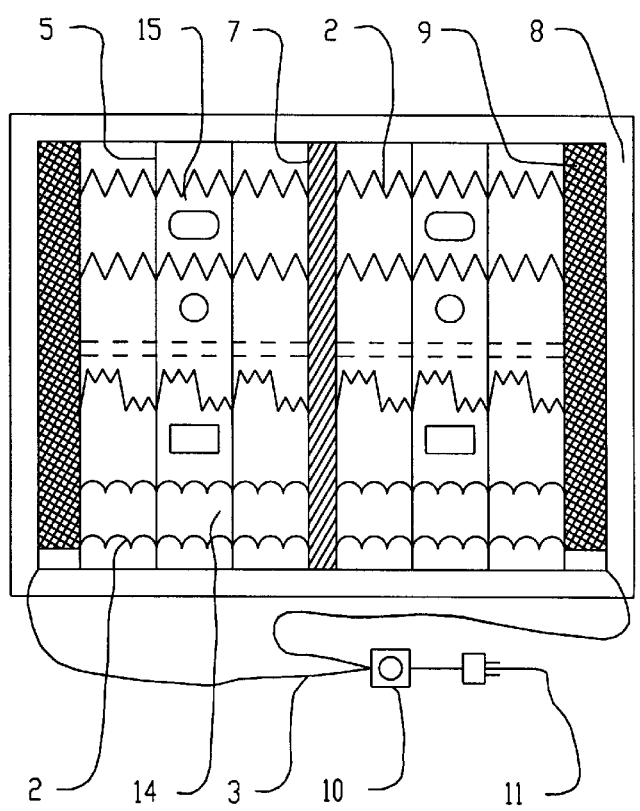
FIG. 3 shows a plan view of the heating element core, connected in parallel and consisting of various electroconductive threads woven into, laminated between or embroidered on an electrically non-conductive substrate. Optional local area treatments and positive temperature coefficient (PTC) material may be utilized in this embodiment.

FIG. 3 shows an example of heater utilizing various conductive threads (2), such as metal coated synthetic polymer or inorganic threads, carbon coated inorganic threads, threads impregnated with conductive ink, and/or other types of conductive threads woven into, laminated between or embroidered on a non-conductive substrate (14) in any pattern as may be dictated by the heating element design. The non-conductive substrate (14) for embroidering or laminating may be made of woven or non-woven textile, vinyl sheet, silicon rubber, polyethylene or polyurethane sheet or any other synthetic material. This example of heating element contains optional localized treated areas in order to augment the electrical characteristics of the heater. These localized treated areas may consist of electrical circuit bridging threads (5), positive temperature coefficient (PTC) materials (7), and cut out areas (15). The cut out areas (15) are only one embodiment of gaps, necessary for sealing and/or fusing the outer insulation layer(s). The other embodiments of gaps may be areas of non-conductive material between conductive threads.

The optional PTC material may be located in the middle of the heating element between the bus electrode conductors (9), as shown in FIG. 3, near at least one bus electrode conductor or combined with at least one of the bus electrode conductors as its integral component.

The heater is energized by power cord (3), equipped with electric power level controller (10) and a plug (11). It is important to note that embroidering of a heating element circuit provides for virtually unlimited flexibility of design and is a novel and unique approach in making of heating elements. Embroidering on or laminating of the conductive threads between the nonconductive materials allows to reduce the weight and cost of the heating element.

Figure 4:
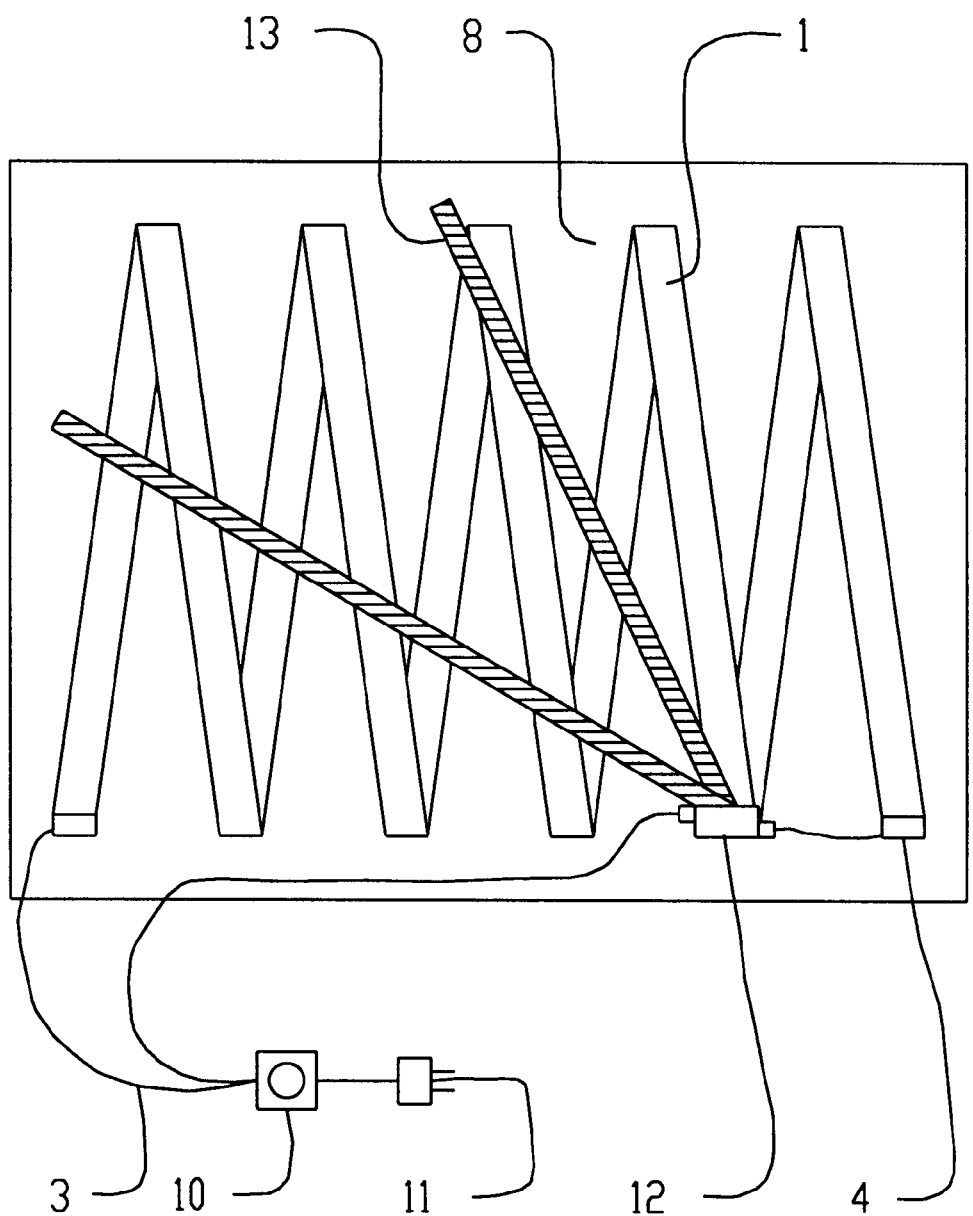
FIG. 4A shows a plan view of a temperature sensing device designed to limit a number of thermostats in a heating element and to afford a more convenient location for the remaining thermostats.
FIG. 4B shows a cross section of the heating element strip made by jacketing of electrically conductive and non-conductive strands of threads by non-conductive materials.
FIG. 4C shows a cross section of the heating element core made by extruding polymer material around a woven heating element strip, said strip being made by interweaving electrically conductive threads with non-onductive yarns.
FIG. 4D shows a cross section of the heating element strip made by extruding polymer material around strands of electrically conductive and non-conductive threads.

FIG. 4A shows a novel temperature sensing device (13), which senses a localized temperature change and, being highly thermoconductive, delivers heat to a thermostat (12) from different heating areas. This enables placement of thermostats in the least objectionable locations. For example, in the case of a heating pad, mattress pad or a heating blanket, thermostats may be located at the power cord attachment location and/or at the edges of an appliance. Utilizing this device may also reduce the number of necessary thermostats. The device consists of a highly thermoconductive strip or threads disposed across the heating element core and preferably insulated from one side to prevent the dissipation of heat. One end of the thermoconductive strip or bundle of threads is attached to or wound around a thermostat so as to enable its quick activation in case of overheating of the heating element assembly. The thermoconductive sensor may also be in a form of a patch placed on top or under a thermostat and having an area considerably larger than the thermostat.

Figure 4B:
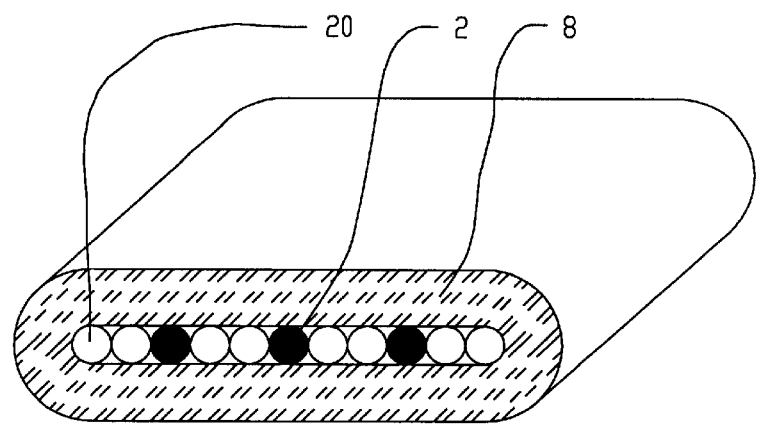

FIG. 4B shows a cross section through the heating strip where the conductive textile fibers (2) and nonconductive fibers (2) are placed parallel to each other and jacketed by insulation means (8).

Figure 4C:
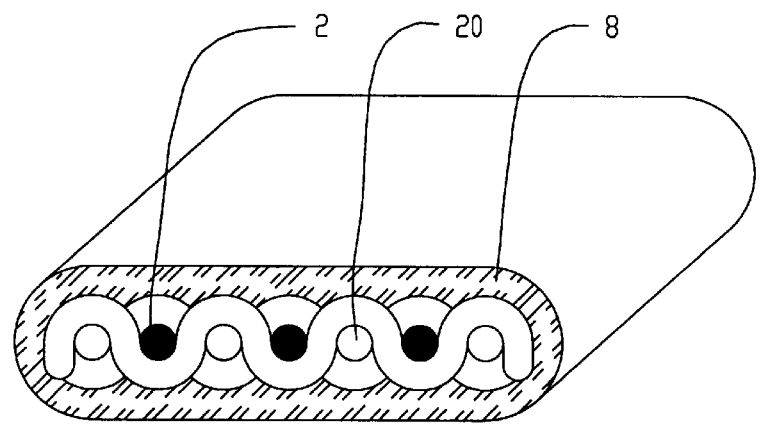

FIG. 4C shows a variation of the embodiment shown in
FIG. 4B, where the conductive (2) and nonconductive (20) fibers are woven into a strip prior to enclosure in the insulation means (8). In addition to being enclosed by the exterior insulation sheath, the conductive threads (20) may be individually insulated prior the weaving process.

Figure 4D:
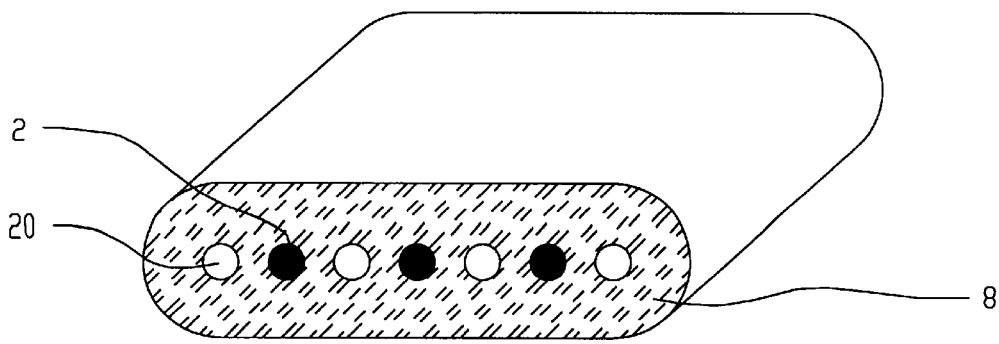

FIG. 4D shows a variation of the embodiment shown in FIG. 4C, where the insulation material (8) is extruded in such manner that the individual nonconductive fibers (2) and conductive fibers (2) or strands of such fibers are fully embedded into the insulating material.

Figure 5:
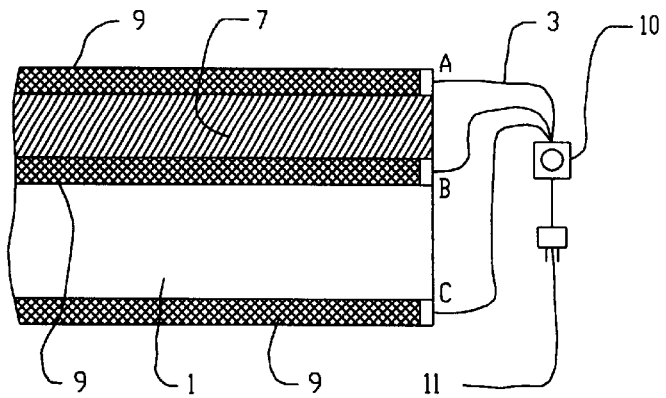
FIG. 5 shows a plan view of a heating element utilizing conductive textile and positive temperature coefficient (PTC) material to create a wide, PTC controlled, heating circuit. This heater offers a combination heating regimes.

FIG. 5 shows a heating element, which utilizes known positive coefficient (PTC) technology with conductive textile technology, creating a novel and synergetic effect. It enables creation of a wide, PTC controlled, heating circuit through energizing busses (A) and (C), and narrow, PTC controlled, heating circuit through energizing busses (A) and (B), all in one heater.

This embodiment also allows for a heating surface with temperature limits above those of PTC, when energized through busses (B) and (C). Numerous combinations or sequence of bus electrodes (9), PTC material (7) and conductive textile (1) are possible, depending on the end use requirements.

Figure 6:
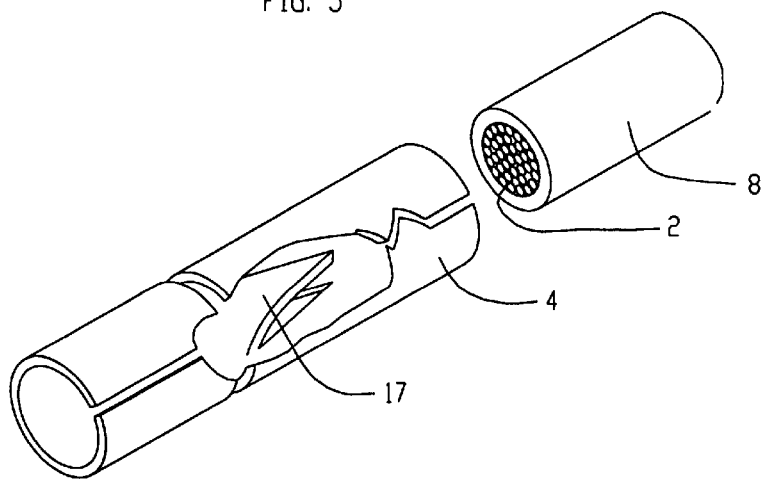
FIG. 6 shows an isometric view of a tooth connector utilized to attach conductive textile thread, bundle, strand or rope heating cable to a power lead or another heating cable.

FIG. 6 shows an example of embodiment of heating element core (1) in a form of a thread, bundle of threads, or a rope. The heating element core, covered and encapsulated by insulating layer (8), is energized through a power cord, which is connected to the heating element with pressure connector (4). The tight connection to the heating cable is achieved through insertion of the tooth connector (17) into a transverse cut in the heating cable and subsequent tight squeezing of the pressure connector shell around the tooth (17).

This heating element core may also be utilized in a flat heater by laying it out in a pattern dictated by the heating element design on a shape holding and/or insulating substrate so as to form gaps for subsequent sealing by the shape holding/insulating material.

Figures 7A, 7B:
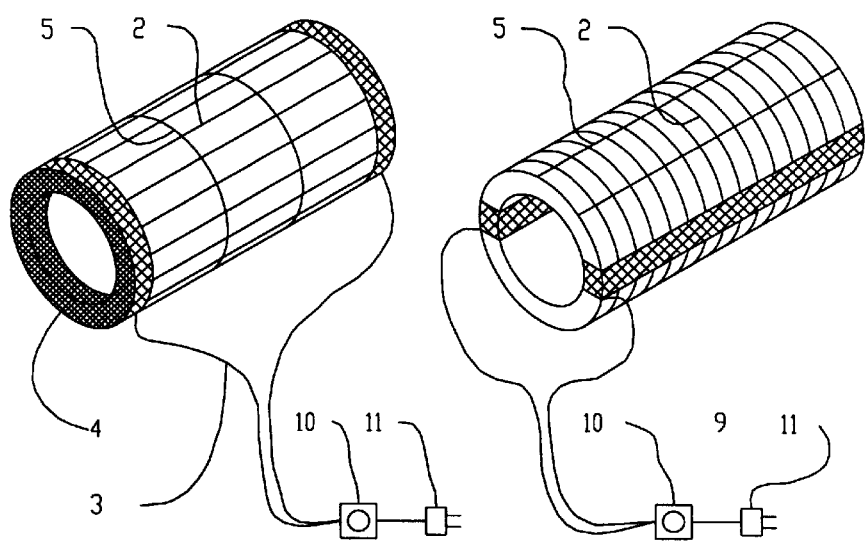
FIGS. 7A–7C show an isometric view of several embodiments of the invention in the form of heating sleeves.

FIG. 7 shows example of tubular heating elements intended for heating of pipes or as heating sleeves for various heating purposes, including health and industrial applications. FIG. 7(A) shows a heating sleeve with bus electrodes (4) located at the ends and the resistance threads (2) connected to the busses in parallel. Optional circuit bridging threads (5) may be utilized to provide electrical continuity and continued heating capability in case of localized damage to a limited number of heating threads (2). This type of heating element may be utilized when the length and the power output of a heater are known fixed quantities.

Figure 7C:
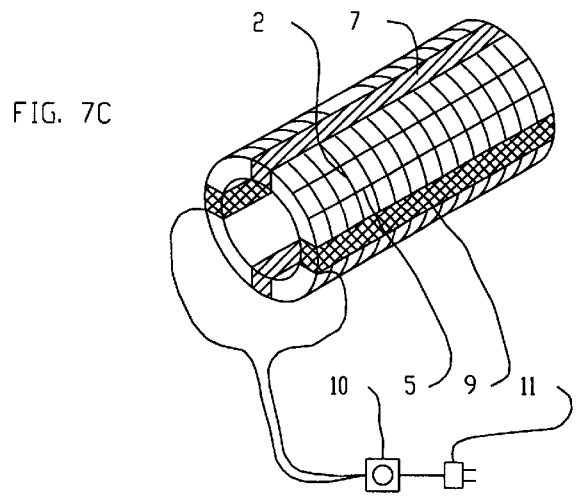

For the variable length heating elements an embodiment shown in FIG. 7(B) is more suitable. This embodiment shows a heating element with bus electrodes (9) placed longitudinally, extending full length of the heating element. The resistance threads (2) are connected to the busses in parallel. Optional circuit bridging threads (5) may be utilized to provide electrical continuity in case of localized damage to a limited number of heating threads (2). FIG. 7(C) shows a variation of the heating element shown in FIG. 7(B) utilizing optional PTC material in order to control localized overheating and forgo the use of thermostat.

Figure 8:
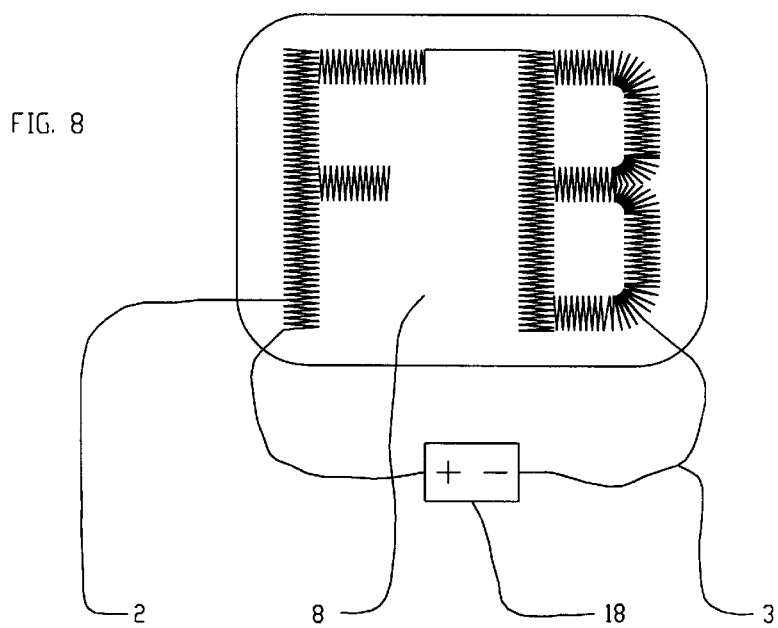
FIG. 8 shows a plan view of an infra red glowing embroidered insignia, designed to be visible through the night vision devices.

FIG. 8 shows an embodiment of a heating element utilizing electroconductive threads (2) to embroider a desired pattern or design on an electrically non-conductive substrate (8).

One of the uses for this design is in military and/or law enforcement, where an identifying insignia can be embroidered on the personnel closing to enable easy identification in the darkness while using night vision scopes. Only a small power source (18), sufficient to generate up to 0.1 Wt/inch$^2$, will provide adequate heat to be clearly distinguishable through the night vision devices.

Figure 9:
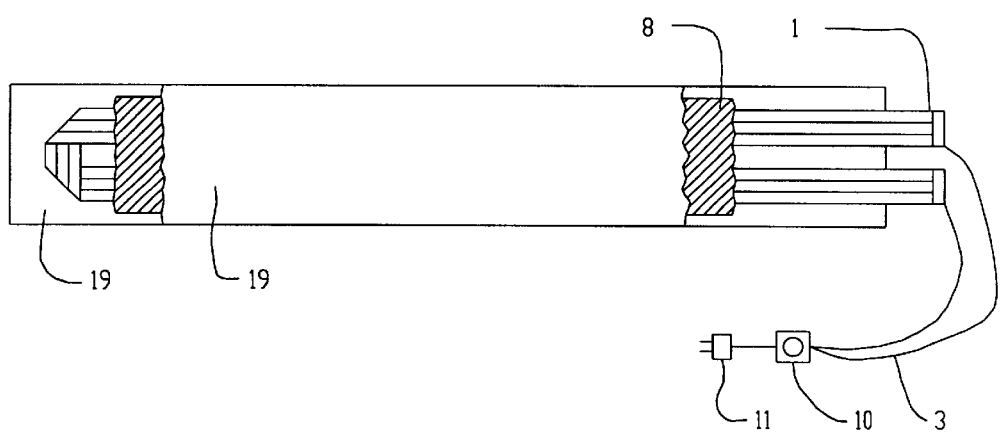
FIG. 9 shows a plan view of a strip heating element installed in window blind vanes to heat the surrounding air.

FIG. 9 shows an embodiment of a heated window blinds vane. It utilizes conductive textile strips (1) held in a desired shape and insulated by fusible interfacing (8). The finished heating element is then installed into a fabric or plastic window blinds vane. The conductive strip is connected through power leads (3), to a power source located in the window blinds track. A similar design may be utilized in ceiling fan blades in order to heat circulated air or to provide localized comfort heating in modular office partitions/dividers The proposed soft heating elements may be utilized in a variety of commercial and industrial heater applications, utilizing direct or alternating current. The main advantage of the heating elements is the high reliability, which is provided by the tightly sealed soft and durable electrically conductive threads.

The process of manufacturing of the insulated heating elements can be fully automated, it utilizes commercially available nontoxic, nonvolatile and inexpensive products. Some designs of the insulated heating core may be manufactured in rolls or spools with subsequent cutting to desired sizes and further attachment of electric power cords and optional power control devices.

The softness and the low temperature density of the conductive heating elements of the invention enable its utilization in novel and unique applications. One of such applications is a heat/cool pad for therapeutic use as shown in FIGS. 10A and 10B. This pad combines a surface heating element (conductive thread 2), a heat/cold conserving gel 22, and a refrigeration circuit 23 including cooling media 24 placed inside or close to the gel pouch. This design enables an alternating heat and cold application with the same device. The variation of such gel pouch design may include a heat function only. The uses of such gel containing devices are very versatile and may include child car seat/carrier heater, food warmer/cooler, comfort heating and cooling pads, and other devices.

Further, the use of electrically conductive metal coated threads, metal fiber containing threads, carbon coated inorganic threads, threads impregnated with conductive ink, carbon/graphite yarns, non-conductive ceramic or polymer fibers in the heating element has the following additional advantages:

- it enables manufacturing of thin, soft and uniformly heating devices without utilizing conventional metal heater wires;
- it provides high durability of the heating appliances which can withstand sharp folding, small perforations, punctures and compression without decreasing of electrical operational capabilities;
- it provides high tear and wear resistance owing to: (a) high strength of the conductive threads and (b) tight enveloping around all electrically conductive media with strong insulating materials;
- it provides for manufacturing of corrosion and erosion resistant heating element owing to: (a) high chemical inertness of the carbon coated inorganic threads and ceramic yarns, (b) hermetic polymer insulation of the whole heating element, including electrode connections and temperature control devices, for utilization in chemically aggressive industrial or marine environments;
- it offers versatility of variation of the electrical conductivity of the heating element core owing to: (a) weaving, embroidering or stranding of the electrically conductive threads to the predetermined width and thickness of the strips, sleeves, sheets, ropes or strands of threads; (b) weaving of the yarns to the predetermined density or type of weaving; (c) weaving, embroidering or stranding of the conductive threads having different electrical conductivity in one unit; (d) weaving, embroidering or stranding of the conductive threads with nonconductive ceramic and/or polymer threads or fibers. (e) making cut outs of different shapes to vary the electrical resistance of the heating element core.
- it provides for saving of electric power consumption owing to: (a) installation of heat reflective layer and (b) possibility of placing the heating element with less cushioning and insulation closer to the human body or to the heated object;
- it allows for manufacturing of heating element with electrical connection of electrically conductive strips, ropes, sheets, sleeves/pipes or strands in parallel or in series;
- it overcomes the problem of overheated spots owing to (a) high heat radiating surface area of the heating element core, (b) uniform heat distribution by the heat reflective layer, reducing the possibility of skin burns or destruction of the insulating layers;
- it provides for extremely low thermal expansion of the heating element owing to the nature of the electrically conductive threads, polymer or nonconductive yarns/fibers. This feature is extremely important for construction applications (Example:—concrete) or for multi-layer insulation with different thermal expansion properties;
- it offers high degree of flexibility and/or softness of the heating appliances depending on the type and thickness of insulation; and
- it provides technological simplicity of manufacturing and assembling of said heating element.

Further, a combination of the electrically conductive threads and PTC material allows to: (a) provide temperature self-limiting properties to the soft heating appliances, eliminating need for thermostats; (b) increase the distance between the bus electrodes, decreasing the risk of short circuit between said bus electrodes; (c) provide larger heat radiating area resulting in higher efficiency of the heater; (d) provide a barrier for liquid penetration to the parallel bus conductors in the event of puncturing the insulated heating element core.

Further, the proposed heating elements can be utilized in, but not limited to: (a) electrically heated blankets, pads, mattresses, spread sheets and carpets; (b) wall, office dividers, window blind vanes, fan blades, furniture, ceiling and floor electric heaters; (c) vehicle, scooter, motorcycle, boat and aircraft seat heaters; (d) electrically heated safety vests, garments, boots, gloves, hats and scuba diving suits; (e) food (Example:—pizza) delivery and sleeping bags; (f) refrigerator, road, roof and aircraft/helicopter wing/blade deicing systems, (g) pipe line, drum and tank electrical heaters, (h) electrical furnace igniters, etc. In addition to the heating application, the same conductive textile heating element core may be utilized for an anti static protection.

The aforementioned description comprises different embodiments which should not be construed as limiting the scope of the invention but, as merely providing illustrations of some of the presently preferred embodiments of the invention. Additional contemplated embodiments include: (a) heating element core may include yarns made of ceramic fibers, such as alumina, silica, boria, boron nitride, zirconia, chromia, magnesium, calcia, silicon carbide or combination thereof; (b) heating element core may comprise electrically conductive carbon/graphite or metal coated ceramic fibers, such as alumina, silica, boria, zirconia, chromia, magnesium, calcia, silicon carbide or combination thereof; (c) the metal coating can be applied on carbon/graphite threads/yarns; (d) the conductive carbon coated ceramic may take a form of conductive carbide coating due to the reaction between the carbon and ceramic base during high temperature deposition; (e) the heating element assembly may comprise the conductive strips, ropes, sleeves/pipes, sheets or threads, having different electrical resistance; (f) the heating element core may be formed into various patterns such as serpentine or other desired patterns, including ordinary straight, coil or "U" shaped forms; (g) the electric power cord can be directly attached to the conductive heating element core without the use of electrodes, it is possible to utilize electrically conductive adhesive, conductive paint, conductive polymer, etc. to assure good electrical connection; (h) the conductive heating element core can be electrically insulated by the soft non-conductive fabrics or polymers by sewing, gluing, fusing, spraying, etc., forming a soft multi-layer assembly; (i) the conductive soft heating element core can be electrically insulated by rigid non-conductive materials like ceramics, concrete, thick plastic, wood, etc.; (j) the shape holding means can be applied on any part of the heating element core; (k) the heating element core may be first insulated by the non-conductive material and then laid out in a desired pattern.

While the foregoing invention has been shown and described with reference to a number of preferred embodiments, it will be understood by those possessing skill in the art that various changes and modifications may be made without departing from the spirit and scope of the invention.

What is claimed is:

1. A soft heater having a durable construction for incorporation into a plurality of articles, said heater comprising electrically conductive textile threads as electrical resistance heating means, said heating means are electrically connected in parallel and disposed between two exterior and at least one interior conductive electrode means for introducing current to a heating means, said electrode means are electrically interconnected in such manner as to enable electrical operating regimes comprising:

energizing of said heater through exterior conductive electrode means from power leads with differing electrical potential, energizing of said heater in such manner that the adjacent energized electrode means, including interior electrode means, have different electrical potential.

2. A soft multiconductor heater having a durable construction for incorporation into a plurality of articles, said heater comprising:

a conductive electrode means for introducing an electrical current to said heater;

at least one continuous electrically conductive textile heating element core, which comprises carbon coated nonmetallic inorganic threads as electrical resistance heating means, electrically redundant means for providing redundant electrical circuits, diversity and control of electrical resistance in selected areas of said heater, an insulating means for insulating at least said carbon coated inorganic threads with nonconductive means.

3. The soft heater according to claim 2, further including localized treatment of selected areas, comprising a positive temperature coefficient material for providing temperature self limiting capabilities to said heater.

4. The soft heater according to claim 1, further including:

at least two bus conductors, running through a length of said heater, at least one selected area of said heater comprising positive temperature coefficient material, at least one portion of electrically conductive textile, disposed longitudinally between at least two of said bus conductors, providing that each one portion of said positive temperature coefficient material directly connects to not more than one of said bus conductors.

5. The soft heater according to claim 4, wherein said positive temperature coefficient material connects to said bus conductors by embedding said bus conductor in said positive temperature coefficient material.

6. The soft heater according to claim 1, wherein said electrically redundant means comprise electrically conductive textile threads bridging electrical circuits between said heating means.

7. The soft heater according to claim 2, wherein said conductive electrode means are thin metal coated textile threads incorporated into the matrix of said heating strip to form bus electrode assembly.

8. The soft heater according to claim 2, further including a heat reflecting layer, placed on at least one side of said heater, and electrically insulated from said conductive electrode means.

9. A soft multiconductor heater having a durable construction for incorporation into a plurality of articles, said heater comprising:

at least one continuous electrically conductive textile heating strip, which comprises sets of textile threads individually encapsulated by insulating means, disposed longitudinally in said strip, said textile threads comprise metal containing fibers as electrical resistance heating means, said strip is laid out in predetermined pattern to fit an area of said heater;

at least one gap between portions of said at least one heating strip;

a conductive electrode means for introducing an electrical current to said heating means.

10. The soft heater according to claim 9, wherein said textile threads comprise metal coated synthetic polymer textile fibers.

11. The soft heater according to claim 9, wherein said textile threads comprise metal coated carbon textile fibers.

12. The soft heater according to claim 9, wherein said textile threads comprise metal coated inorganic textile fibers.

13. The soft heater according to claim 9, wherein said textile threads comprise at least one metal fiber containing textile thread.

14. The soft heater according to claim 9, further including a heat conserving gel, hermetically sealed into a pouch by the nonconductive means and disposed on at least one side of said heating means.

15. The soft heater according to claim 9, further including a refrigeration circuit to provide for alternating heating and cooling cycles.

16. A soft heater having a durable construction for incorporation into a plurality of articles, said heater comprising:

a conductive electrode means for introducing an electrical current to said heater;

a planar array of soft electrical resistance heating conductors, comprising metal containing heating textile fiber threads electrically connected to said conductive electrode means;

at least one layer of nonconductive lamninate means for insulating and fixing said heating threads in place.

17. A soft multiconductor heater having a durable construction for incorporation into a plurality of articles, said heater comprising:

at least one continuous textile heating strip, which comprises conductive metal containing textile threads as electrical resistance heating means, said threads are disposed longitudinally in said strip and separated from each other by nonconductive means, said strip is laid out in predetermined pattern to fit an area of said heater;

electrically redundant means for providing redundant electrical circuits, diversity and control of electrical resistance in selected areas of said heating strip;

at least one gap between portions of said at least one heating strip;

a conductive electrode means for introducing an electrical current to said heating means;

an insulating means for insulating at least said metal containing textile threads with nonconductive means.

18. The soft heater according to claim 17 wherein said electrically redundant means comprise a positive temperature coefficient material for providing temperature self limiting capabilities to said heater.

19. The soft heater according to claim 17 wherein said electrically redundant means are the selected areas, comprising electrically conductive carbon carrying material.

20. The soft heater according to claim 17, wherein said electrically redundant means comprise electrically conductive textile threads bridging electrical circuits between electrically conductive threads in said heating means.

21. The soft heater according to claim 17 further including a shape holding means for connecting and holding said portions of said heating strip in the predetermined pattern.

22. The soft heater according to claim 17, further including a heat reflecting layer, placed on at least one side of said soft heater, and electrically insulated from said electrically conductive heating strip and said conductive electrode means.

23. A soft heater having a durable construction for incorporation into a plurality of articles, said heater comprising:
- a conductive electrode means for introducing an electrical current to said heater;
- a soft electrical resistance heating means comprising metal containing nonmetallic textile threads, said threads are separated from each other by nonconductive means and electrically connected to said conductive electrode means;
- electrically redundant means for providing redundant circuits, diversity and control of electrical resistance in selected areas of said heating means;
- an insulating means for insulating at least said metal containing nonmetallic textile threads with nonconductive means.

24. The soft heater according to claim 23, wherein said electrically redundant means comprise a positive temperature coefficient material for providing temperature self limiting capabilities to said heater.

25. The soft heater according to claim 23 further including:
- at least two conductive electrode means for introducing electrical current to said heater, said electrode means are disposed at the edges of said heating means,
- at least one selected area of said heater comprising positive temperature coefficient material,
- at least one portion of electrically conductive textile, disposed longitudinally between at least two of said conductive electrode means, providing that each one portion of said positive temperature coefficient material directly connects to not more than one of said conductive electrode means.

26. The soft heater according to claim 25, wherein said positive temperature coefficient material connects to said conductive electrode means by embedding said electrode means in said positive temperature coefficient material.

27. The soft heater according to claim 23, wherein at least one of said conductive electrode means comprises thin metal containing textile threads incorporated into a matrix of said heating means.

28. The soft heater according to claim 23, further including a heat reflecting layer, placed on at least one side of said heater, and electrically insulated from said heating means and said conductive electrode means.

29. A soft textile heater having a durable construction for incorporation into a plurality of articles, said heater comprising:
- a conductive electrode means for introducing an electrical current to said heater;
- a soft heating means, comprising textile threads impregnated with electrically conductive ink, said textile threads are electrically connected to said conductive electrode means;
- an insulating means for insulating at least said textile threads impregnated with electrically conductive ink with nonconductive means.

30. A soft textile heater having a durable construction for incorporation into a plurality of articles, said heater comprising:
- electrically conductive textile sleeve having hollow interior and continuous cross-section, comprising electrically conductive textile fiber threads as electrical resistance heating means, said threads are separated from each other by nonconductive means;
- a conductive electrode means for introducing an electrical current to said heating means;
- an insulating means for insulating at least said electrically conductive textile threads with nonconductive means.

31. The soft heater according to claim 30, wherein said electrically conductive textile threads comprise threads impregnated with electrically conductive ink.

32. The soft heater according to claim 30, wherein said electrically conductive textile threads comprise carbon coated inorganic textile threads.

33. The soft heater according to claim 30, wherein said electrically conductive textile threads comprise carbon containing threads.

34. The soft heater according to claim 30, wherein said electrically conductive textile threads comprise metal containing threads.

35. The soft heater according to claim 30, further including a refrigeration circuit to provide for alternating heating and cooling cycles.

36. The soft heater according to claim 30 wherein said fiber threads comprise individually insulated sets of textile fiber threads.

37. A soft textile heater having a durable construction for incorporation into a plurality of articles, said heater comprising:
- electrically conductive textile sleeve having hollow interior and continuous cross-section, comprising carbon containing textile fiber threads as electrical resistance heating means;
- a conductive electrode means for introducing an electrical current to said heating means; electrically redundant means for providing redundant electrical circuits and control of electrical resistance in selected areas of said heating means;
- an insulating means for insulating at least said electrically conductive textile fiber threads with nonconductive means.

38. The soft heater according to claim 37, wherein said electrically redundant means comprise a positive temperature coefficient material for providing temperature self limiting capabilities to said soft heater.

39. The soft heater according to claim 37 further including:
- at least two conductive electrode means for introducing current to said heating means, running through the length of said heater,
- at least one electrically redundant means of said soft heater, said electrically redundant means comprise positive temperature coefficient material,
- at least one portion of said electrically conductive sleeve, disposed longitudinally between at least two of said electrode means, providing that each one portion of said positive temperature coefficient material directly connects to not more than one of said electrode means.

40. The soft heater according to claim 39 wherein said positive temperature coefficient material connects to said conductive electrode means by embedding said electrode means in said positive temperature coefficient material.

41. A flexible heater having a durable construction for incorporation into a plurality of articles, said heater comprising at least one section of electrically conductive textile, as electrical resistance heating means, disposed longitudinally between at least two parallel conductive electrode means for introducing current to said heating means, provided that at least one of said two electrode means comprises metal containing textile threads, which are electrically connected to a positive temperature coefficient material, said positive temperature coefficient material is directly connected to at least two parallel electrode means.

42. A soft heating element having a durable construction for incorporation into a plurality of articles, said element comprising:

- at least one continuous electrically conductive textile strip, including metal fiber containing threads, incorporated longitudinally into said strip, said strip is cut to a desired length, folded and laid out to fit within said heating element and define folded portions, provided that said soft heating element comprises at least one gap between the folded portions of said at least one strip;
- a conductive means for introducing an electrical current to said textile strip;
- an insulating means for insulating said electrically conductive textile strip with at least one layer of nonconductive means.

43. A soft heating element having a durable construction for incorporation into a plurality of articles, said element comprising:

- at least one continuous electrically conductive textile strip, including metal coated nonmetallic textile threads, incorporated longitudinally into said strip, said strip is cut to a desired length, folded and laid out to fit within said heating element and define folded portions provided that said soft heating element comprises at least one gap between the folded portions of said at least one strip;
- a conductive means for introducing an electrical current to said textile strip;
- an insulating means for insulating said electrically conductive textile strip with at least one layer of nonconductive means.

44. A soft heating element having a durable construction for incorporation into a plurality of articles, said element comprising:

- at least one continuous electrically conductive textile strip, including nonmetallic textile threads impregnated with conductive ink, incorporated longitudinally into said strip, said strip is cut to a desired length, folded and laid out to fit within said heating element and define folded portions, provided that said soft heating element comprises at least one gap between the folded portions of said at least one strip;
- a conductive means for introducing an electrical current to said textile strip;
- an insulating means for insulating said electrically conductive textile strip with at least one layer of nonconductive means.

* * * * *